Figure 1:
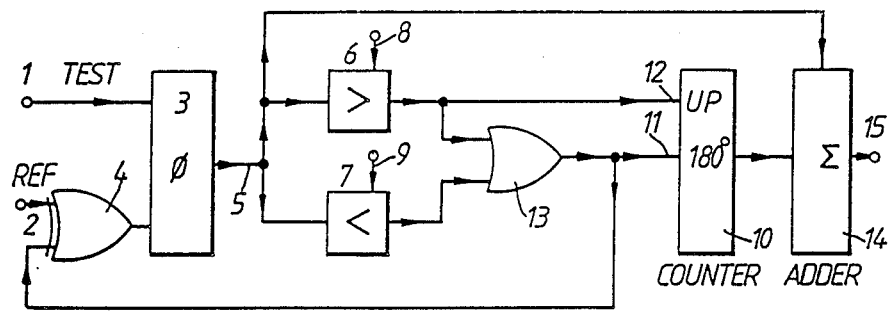

United States Patent [19]

Bridgman

[11] Patent Number: 4,868,512
[45] Date of Patent: Sep. 19, 1989

[54] PHASE DETECTOR
[75] Inventor: Roger F. Bridgman, London, England
[73] Assignee: Marconi Instruments Limited, St. Albans, United Kingdom
[21] Appl. No.: 79,536
[22] Filed: Jul. 31, 1987
[30] Foreign Application Priority Data
 Aug. 2, 1986 [GB] United Kingdom ............... 8618941
[51] Int. Cl.⁴ .............................................. H03K 9/06
[52] U.S. Cl. ...................................... 328/133; 307/511
[58] Field of Search .................... 328/133, 134, 155; 307/470, 510, 514, 516, 511
[56] References Cited
U.S. PATENT DOCUMENTS
 3,849,671 11/1974 Molack ........................... 307/514 X
 4,001,680 1/1977 Bylund et al. .................. 328/133 X
 4,001,682 1/1977 Watt .................................. 328/155 X Primary Examiner—Steven Mottola
Attorney, Agent, or Firm—Lowe, Price, LeBlanc, Becker & Shur

[57] ABSTRACT

A phase detector for indicating the magnitude of a phase difference between two electrical signals applied to it, is provided with means for introducing a deliberate phase shift into one of the signals so that the measured phase difference never closely approaches 0° or a multiple of 360°. The detector is capable of providing a smooth output signal over a very wide range of phase difference which can exceed many multiples of 360°. Furthermore, the phase comparator is never required to perform measurements in those regions of least accuracy close to zero phase difference.

6 Claims, 1 Drawing Sheet

PHASE DETECTOR

This invention relates to phase detectors; that is to say, to an electrical detector which is responsive to the difference in phase of two electrical signals which are applied to it. Generally, the accuracy of the phase detector varies with the magnitude of the phase difference being measured, and the accuracy deteriorates sharply for phase differences which are small or which are multiples of 360°. The present invention seeks to provide an improved phase detector which does not suffer from this drawback and which is operable over a range of phase differences in excess of 360°.

According to this invention, a phase detector includes means for receiving two electrical signals and for providing an indication of the magnitude of the measured phase difference between them; and means responsive to said magnitude if it is less than a threshold value for altering the phase of one of the received electrical signals so as to increase the phase difference; and means for indicating that said phase alteration has taken place.

The invention therefore avoids a common difficulty which arises if a small phase difference is to be measured in the presence of noise. A frequently used method of measuring the phase difference between two signals is to measure the time difference between their zero crossings. A minimum reading is obtained when the test signal just leads the reference (so as to indicate phase difference of the order of 0°) and a maximum reading is obtained when the reference just leads the test signal (so as to indicate a phase difference of the order of 360°). When zero crossings are close together and noise is present, the detector will read minimum and maximum values at random. Furthermore, the linearity of typical detectors falls off as this point is approached. By resetting the phase of one of the signals as the phase difference falls below a threshold value, i.e. as it approaches 0° or 360° it can be ensured that the phase detector is not required to operate in the region of the deadband described previously and furthermore the phase detector can be caused to operate over its most linear region so as to enhance the accuracy of the signal which it produces. Each time the phase of one of the input signals is reset, this alteration is recorded so that a suitable modification can be made to the output signal so as to include reference to this phase alteration. In this way, by successively adding in the phase alterations which occur, the device can be caused to operate over a range of phase differences which is many multiples of 360°. Although in practice it is convenient and simplest to alter the phase of just one of the input signals it is, in principle, possible to alter the phase of both of them but this would add some complication.

The invention is further described by way of example, with reference to the accompanying drawings, in which:

FIG. 1 illustrates the phase detector in accordance with this invention, and

Figure 2:
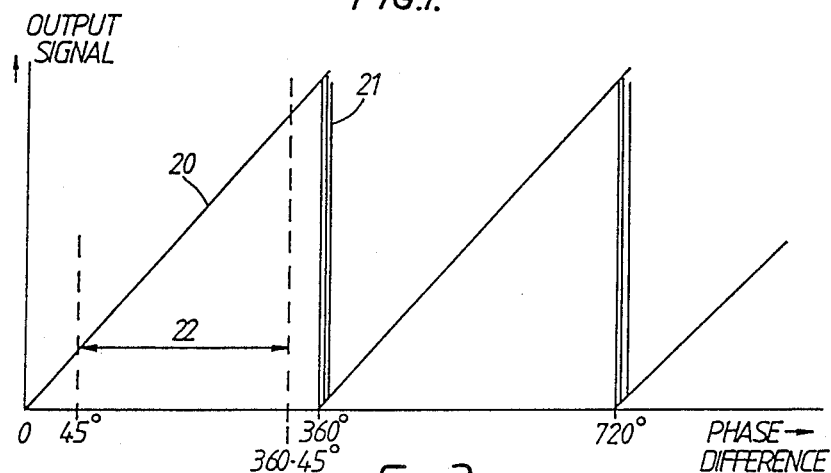
Figure 3:
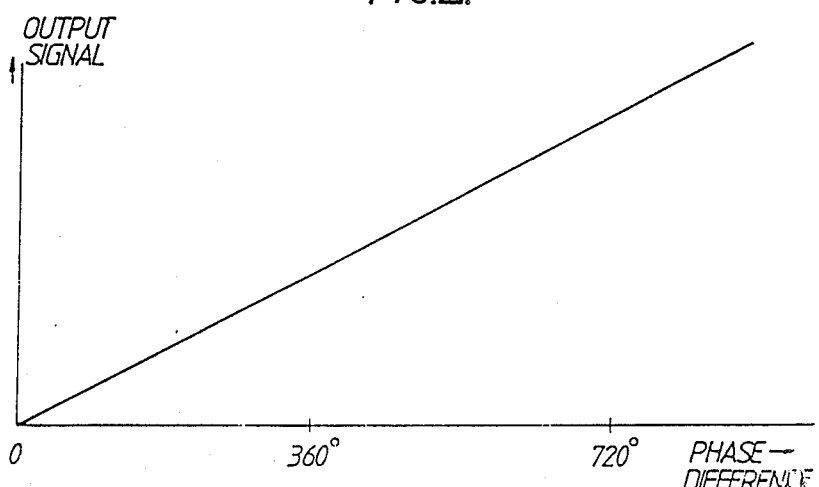

FIGS. 2 and 3 are explanatory diagrams contrasting the operation of the present phase detector with a previously known phase detector Referring to FIG. 1, the phase detector is provided with a pair of input terminals 1 and 2 at terminal 1 of which a test electrical signal whose phase is to be measured is received, and at the other terminal 2 of which a reference electrical signal is received. If it is merely necessary to determine the phase difference between any two electrical signals it is immaterial which signal is regarded as the test signal and which signal is regarded as the reference signal Generally speaking, meaningful measurement of phase difference can only be performed on electrical signals having the same nominal frequency and it is assumed in the following description that the signals applied to terminals 1 and 2 satisfy this condition.

The signals received at terminals 1 and 2 are in a binary pulse form, that is to say, as a sequence of pulses having only two levels. Such pulses are generally rectangular in shape having steep rising and falling edges.

The terminal 1 is connected to one input of a phase comparator 3, the other input of which is connected to the output of an exclusive OR-gate 4 having two inputs, one of which is connected to input terminal 2. The operation of the phase comparator 3 is conventional and it is operative to provide on an output line 5 a signal whose nature is indicative of the magnitude and polarity of the phase difference present at terminals 1 and 2, provided that the phase difference is less than 360°, a simple phase comparator being, of course, unable to distinguish multiples of 360°. The outputs of the phase comparator 3 are fed to two threshold circuits 6 and 7 both of which receive threshold signals over lines 8 and 9 respectively. In this instance both thresholds are indicative of phase differences of 45°, but one being a phase lag of 45° and the other a phase lead of 45°.

The outputs of the two threshold circuits 6,7, are coupled to an up-down counter 10 having two inputs 11 and 12. The counter is of the kind which clocks down by a count of one when a single input pulse is present at input 11, and clocks up by a count of one when an input pulse is present simultaneously at inputs 11 and 12. Thus, whenever either threshold circuit 6 or 7 generates an output pulse (thereby indicating that its threshold value has been crossed), this pulse is fed via an OR-gate 13 to the counter 10, and whether it increments or decrements its count will depend on which phase threshold has been crossed. Each time a threshold is crossed, a pulse is taken from the output of the OR-gate 13 back to the input of exclusive OR-gate 4. This serves to invert the output of the exclusive OR-gate 4, and so in effect provides a 180° phase shift to that input of the phase comparator 3. As the signals received at terminals 1 and 2 are in binary pulse form, they are suitable for direct application to the logic gates.

Each time the counter 10 is clocked, the new count is passed to an adder 14, where it is added to the actual output of the phase comparator 3, and the resultant value is made available at an output port 15. Thus the counter 10 provides an indication of the multiples of 180° phase difference between the test and reference signals at terminals 1 and 2 to which is added the residual phase difference as measured by the phase comparator 3.

With reference to FIG. 2, the solid line 20 represents a prior art phase detector, in which the magnitude of an output signal falls to a reset value at each multiple of 360°. The transition is not clean, but generally includes a number of random signal excursions 21 as shown. It will be appreciated that in the present invention the phase comparator 3 operates only between the two broken lines indicating a phase difference of +45° and 360°−45°, i.e. a phase difference of ±45° with respect to multiples of 360°. Each time the measured phase difference crosses the threshold value indicated by the broken lines, an artificial phase difference of 180° is introduced into the reference signal input to bring the operation of the phase comparator back into the region 22 between the thresholds. In this way the phase comparator 3 always operates in the region of phase difference at which its accuracy is greatest, and it is never required to operate in a region in which the measured phase difference approaches zero, so that its output will not fluctuate randomly in the presence of noise at either of its inputs.

FIG. 3 shows the actual output signal made available at output port 15. As the counter 10 cumulatively adds or substracts the necessary multiples of 180°, the output signal follows the real value of phase difference which occurs from a datum or "switch-on" point, and will be correct up to many multiples of 360°, the maximum number of multiples being dependent on the capacity of the counter 10 and adder 14.

It will be appreciated that the output curve shown in FIG. 3 is generated directly by the operation of the phase detector, and this is in contrast to a curve which could be generated artificially by computer processing the curve of FIG. 2 to remove the periodic discontinuities. Although in the latter event, the final result might look similar, the output signal would include inaccuracies due to the masked phase jitter in the regions of multiples of 360°, and due to the inherently lower accuracy of operation at small phase differences.

As the logic circuit components shown in FIG. 1 require a short time to operate, the phase detector is suitable for a sampling mode of operation; that is to say, the two input signals at terminals 1 and 2 are periodically sampled, and the samples applied to the circuit shown. When the current samples have been processed to generated an output value at port 15, the input signal are again sampled. In practice the periods between samples will be very short indeed, but rapidly varying phase differences may not be followed properly if the phase difference between consecutive samples alters by more than the phase difference between the two threshold values, i.e. by more than 270° in the preceding example.

I claim:

1. A phase detector including means for receiving two electrical signals and for providing an indication of the magnitude of the measured phase difference between them; and means responsive to said magnitude if it is less than a threshold value for altering the phase of one of the received electrical signals so as to increase the phase difference; means for indicating that said phase alternation has taken place; and summation means for combining the measured phase difference with the said alternations in phase to indicate cumulative phase changes which may be in excess of 360°.

2. A phase detector including means for receiving two electrical signals and for providing an indication of the magnitude of the measured phase difference between them; and means responsive to said magnitude if it is less than a threshold value for altering the phase of one of the received electrical signals so as to increase the phase difference; means for indicating that said phase alternation has taken place; and means for storing the successive alternations in phase; wherein the means for storing the successive alternations in phase comprise a reversible counter adapted to count in increments in one direction in response to an increasing phase lead, and to count in increments in the opposite direction in response to an increasing phase lag.

3. A phase detector including means for receiving two electrical signals and for providing an indication of the magnitude of the measured phase difference between them; and means responsive to said magnitude if it is less than a threshold value for altering the phase of one of the received electrical signals so as to increase the phase difference; means for indicating that said phase alternation has taken place, and wherein two threshold values are provided, and which differ by the same amount of phase difference above and below multiples of 360°.

4. A phase detector as claimed in claim 3 and wherein the two threshold values are +45° and −45°.

5. A phase detector including means for receiving two electrical signals of the same nominal frequency and for providing an indication of the magnitude of the measured phase difference between said signals; means responsive to said magnitude if it is less than a threshold value for altering the phase of one of the received electrical signals so as to increase the phase difference; means for indicating that said phase alternation has taken place; and means for storing the successive alternations in phase comprising a reversible counter adapted to count in increments in one direction in response to an increasing phase lead and to count in increments in the opposite direction in response to an increasing phase lag.

6. A phase detector as claimed in claim 5 wherein two threshold values are provided, said values differing by the same amount of phase difference above and below multiples of 360°.

* * * * *